United States Patent
Vincent

(10) Patent No.: US 9,263,528 B2
(45) Date of Patent: Feb. 16, 2016

(54) METHOD FOR PRODUCING STRAINED GE FIN STRUCTURES

(71) Applicant: IMEC, Leuven (BE)

(72) Inventor: Benjamin Vincent, San Francisco, CA (US)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/047,950

(22) Filed: Oct. 7, 2013

(65) Prior Publication Data

US 2014/0099774 A1  Apr. 10, 2014

(30) Foreign Application Priority Data

Oct. 5, 2012  (EP) ..................................... 12187332

(51) Int. Cl.
 *H01L 21/479* (2006.01)
 *H01L 29/161* (2006.01)
 *H01L 29/66* (2006.01)

(52) U.S. Cl.
 CPC ........ *H01L 29/161* (2013.01); *H01L 29/66795* (2013.01)

(58) Field of Classification Search
 CPC .................. H01L 29/161; H01L 29/66795
 USPC ................................................ 438/431
 See application file for complete search history.

(56) References Cited

U.S. PATENT DOCUMENTS 8,354,320 B1 * 1/2013 Xie et al. .................... 438/279
8,580,642 B1 * 11/2013 Maszara et al. ............. 438/283
8,847,279 B2 * 9/2014 Bai et al. .................... 257/190
2005/0093154 A1 * 5/2005 Kottantharayil et al. ..... 257/745
2006/0292719 A1 * 12/2006 Lochtefeld et al. ............ 438/22

(Continued)

FOREIGN PATENT DOCUMENTS

| DE | 102007007261 | 8/2007 |
| WO | 2007112066 | 10/2007 |
| WO | 2008039495 | 4/2008 |

OTHER PUBLICATIONS

Liow et al., "Investigation of silicon-germanium fins fabricated using germanium condensation on vertical compliant structures"; Applied Physics Letters 87, 262104 2005.*

(Continued)

*Primary Examiner* — Phat X Cao
*Assistant Examiner* — Mohammad M Hoque
(74) *Attorney, Agent, or Firm* — McDonnell Boehnen Hulbert & Berghoff LLP

(57) ABSTRACT

Disclosed are methods for forming fins. In an example embodiment, a method includes providing a substrate that includes at least two elongated structures separated by an isolation region. Each elongated structure comprises a semiconductor alloy of a first semiconductor material and a second semiconductor material, and a relaxed portion of the elongated structure includes the semiconductor alloy in a relaxed and substantially defect-free condition. The method further includes subjecting the substrate to a condensation-oxidation, such that each elongated structure forms a fin and an oxide layer. The fin includes a fin base portion formed of the semiconductor alloy and a fin top portion of the first semiconductor material in a strained condition. The fin top portion is formed by condensation of the first semiconductor material. The oxide layer includes an oxide of the second semiconductor material. The method further includes removing at least some of the oxide layer.

20 Claims, 2 Drawing Sheets

(56) References Cited

U.S. PATENT DOCUMENTS

| | | | |
|---|---|---|---|
| 2007/0181977 A1* | 8/2007 | Lochtefeld et al. | 257/618 |
| 2007/0221956 A1 | 9/2007 | Inaba | |
| 2007/0252199 A1* | 11/2007 | Chung et al. | 257/330 |
| 2008/0001169 A1* | 1/2008 | Lochtefeld | 257/190 |
| 2008/0073667 A1* | 3/2008 | Lochtefeld | 257/190 |
| 2008/0099785 A1* | 5/2008 | Bai et al. | 257/190 |
| 2009/0085027 A1 | 4/2009 | Jin et al. | |
| 2009/0090934 A1* | 4/2009 | Tezuka et al. | 257/190 |
| 2009/0170251 A1 | 7/2009 | Jin et al. | |
| 2010/0025683 A1* | 2/2010 | Cheng | 257/49 |
| 2010/0072515 A1* | 3/2010 | Park et al. | 257/190 |
| 2010/0264468 A1 | 10/2010 | Xu | |
| 2010/0301391 A1* | 12/2010 | Lochtefeld | 257/190 |
| 2011/0024804 A1* | 2/2011 | Chang et al. | 257/288 |
| 2011/0068405 A1* | 3/2011 | Yuan et al. | 257/365 |
| 2011/0147811 A1 | 6/2011 | Kavalieros et al. | |
| 2011/0163355 A1* | 7/2011 | Tezuka et al. | 257/255 |
| 2011/0165738 A1* | 7/2011 | Tezuka et al. | 438/150 |
| 2011/0169049 A1* | 7/2011 | Loo et al. | 257/190 |
| 2011/0180847 A1 | 7/2011 | Ikeda et al. | |
| 2011/0193178 A1* | 8/2011 | Chang et al. | 257/408 |
| 2012/0001171 A1* | 1/2012 | Atanackovic | 257/43 |
| 2012/0018785 A1* | 1/2012 | Xu | 257/288 |
| 2012/0025313 A1* | 2/2012 | Chang et al. | 257/347 |
| 2012/0241818 A1* | 9/2012 | Kavalieros et al. | 257/192 |
| 2012/0305990 A1* | 12/2012 | Cea et al. | 257/192 |
| 2013/0005106 A1* | 1/2013 | Tezuka et al. | 438/299 |
| 2013/0023092 A1* | 1/2013 | Oda et al. | 438/157 |
| 2013/0043506 A1* | 2/2013 | Tsai et al. | 257/192 |
| 2013/0099282 A1* | 4/2013 | Chen et al. | 257/190 |
| 2013/0113026 A1* | 5/2013 | Huang et al. | 257/288 |
| 2013/0153971 A1* | 6/2013 | Guillorn et al. | 257/255 |
| 2013/0154007 A1* | 6/2013 | Cheng et al. | 257/352 |
| 2014/0001562 A1* | 1/2014 | Liaw | 257/369 |
| 2014/0011341 A1* | 1/2014 | Maszara et al. | 438/478 |
| 2014/0027860 A1* | 1/2014 | Glass et al. | 257/401 |
| 2014/0030876 A1* | 1/2014 | Flachowsky et al. | 438/479 |
| 2014/0054705 A1* | 2/2014 | Basker et al. | 257/349 |
| 2014/0091360 A1* | 4/2014 | Pillarisetty et al. | 257/190 |
| 2014/0203326 A1* | 7/2014 | Mukherjee et al. | 257/190 |

OTHER PUBLICATIONS

European Search Report, European Patent Application Serial No. EP 12187332 (Feb. 18, 2013).
Tsung-Yang Liow et al., "Investigation of silicon-germanium fins fabricated using germanium condensation on vertical compliant structures," Applied Physics Letters vol. 87, p. 262104 (Dec. 2005).
C. Rosenblad et al., "A plasma process for ultrafast deposition of SiGe graded buffer layers," Applied Physics Letters vol. 76, No. 4 (Jan. 2000).
T.A. Langdo et al., "High quality Ge on Si by epitaxial necking," Applied Physics Letters, vol. 76, No. 25 (Jun. 2000).
Tsutomu Tezuka et al., "Structural analyses if strained SiGe wires formed by hydrogen thermal etching and Ge-condensation processes." Applied Physics Letters, vol. 94, p. 081910 (Dec. 2009).
Park et al., "Fabrication of Low-Defectivity, Compressively Strained Ge on Si0.2Ge0.8 Structures Using Aspect Ratio Trapping," Journal of the Electrochemical Society 156(4) (Feb. 2009).

* cited by examiner

METHOD FOR PRODUCING STRAINED GE FIN STRUCTURES

CROSS-REFERENCE TO RELATED APPLICATIONS

This application claims priority to European Patent Application Serial No. 12187332.7 filed Oct. 5, 2012, the contents of which are hereby incorporated by reference.

BACKGROUND

In the search for high mobility materials to replace silicon (Si) in digital logic structures, much interest has gone to the development of germanium (Ge) channels, in particular strained Ge, due to the high carrier mobility characteristics of the material.

In order to ensure optimum mobility, essentially defect-free Ge is required, which further leads to the need for a defect-free surface onto which the Ge is produced. A typical technique for depositing a SiGe layer in a narrow trench is referred to as Aspect Ratio Trapping (ART). This typical technique allows filling of narrow trenches (e.g., trenches obtained by STI (Shallow Trench Isolation)) on a Si substrate, with a SiGe layer that does not show defects in the top part of the trenches. All defects observed originate on the Si/SiGe interface and become trapped by the STI sidewalls.

In "Fabrication of Low-Defectivity, Compressively strained Ge on $Si_{0.2}Ge_{0.8}$ Structures using Aspect Ratio Trapping," Journal of the Electrochemical Society, 156(4)H249-H254 (2009), J.-S. Park et al. disclose using this technique, followed by the growth of strained Ge layers on the thus obtained SiGe structures. Optimization of the quality of the Ge-layer is done by performing a pre-baking step prior to Ge-growth.

SUMMARY

A problem with the above-described technique, in which the strained Ge is obtained by epitaxial growth of Ge onto the SiGe in the trenches, is that when filling trenches that have a width of less than 20 nm, twin defects are formed at a higher level in the trench. This puts a limit on the production of fin structures in this way for fin-widths of less than 20 nm.

Disclosed are methods for producing fin-structures comprising strained Ge on a SiGe buffer of less than 20 nm in width. The disclosed methods overcome the above-described limitation on the size of the fins. Structures formed according to the disclosed methods may, for example, be used in quantum well digital logic transistors.

The present disclosure is related to a method for producing one or more semiconductor fin structures, in particular fins comprising a SiGe buffer portion and a strained Ge top portion. The strained Ge portion is formed by oxidizing SiGe structures extending outwards from a surface of an isolation region, such as an STI oxide region produced in a Si substrate. The SiGe structures may be grown in the Si substrate by Aspect Ratio Trapping (ART), thereby obtaining a SiGe structure that is relaxed and essentially defect free in a top region. The oxidation results in the formation of a Ge region and a $SiO_2$ layer covering the fin. The oxidation is continued until a pure strained Ge top portion is obtained on the SiGe base of the fins. The process can involve the oxidation of separate SiGe structures formed by overgrowth of SiGe into separate mushroom-shaped overgrowth portions. In another embodiment, the SiGe structures are formed after a CMP step and the step of etching the oxide regions in between the structures. According to a further embodiment, the SiGe structures are obtained by patterning a SiGe layer that is sufficiently thick so as to obtain relaxed and defect free SiGe in a top sublayer of said SiGe layer.

In one aspect, a method may include providing a substrate including an isolation region and producing at least one elongate structure on a substrate, where each elongate structure comprises a first region consisting of a semiconductor alloy (of a first semiconductor material and a second semiconductor material) and a second region consisting of a relaxed and substantially defect-free alloy material. A portion of each elongate structure may extend outwards with respect to a surface of the isolation region. The method may further include subjecting each elongate structure to an oxidation step, thereby transforming the elongate structure into a fin and an oxide layer. The fin may include a base portion formed of the semiconductor alloy and a top portion formed of the first semiconductor material in a strained condition. The top portion may be formed by condensation of the first semiconductor material. The oxide layer may be formed of the second semiconductor material and may substantially cover the fin. The oxide layer may be formed by oxidation of the second semicondutor material. The method may still further include, for each elongate structure, removing a portion of the oxide layer that extends above the surface of the isolation region, thereby exposing the fin.

In some embodiments, prior to oxidation of the second semiconductor material, a cap layer of the second semiconductor material may be formed on the second region of the elongate structure.

In some embodiments, the condensation of the first semiconductor and/or the oxidation of the second semiconductor material may continue until substantially none of the second semiconductor material remains in the top portion of the fin.

In another aspect, a method is disclosed that includes providing a substrate having a least one fin-shaped area between at least two isolation regions on a surface of the substrate. The method further includes removing substrate material from the at least one fin-shaped areas to thereby create a trench between the at least two isolation regions. The method still further includes growing a semiconductor alloy material in the trench using a technique that allows ART of disclocations in the trench, to thereby obtain relaxed and substantially defect-free semiconductor alloy material in a top portion of the trench and in an overgrowth that extends beyond the trench.

In some embodiments, the method may further include removing a top portion of the at least two isolation regions, such that the overgrowth extends upwards beyond the at least two isolation regions.

In yet another aspect, a method is disclosed that includes providing a substrate having a least one fin-shaped area between at least two isolation regions on a surface of the substrate. The method further includes removing substrate material from the at least one fin-shaped areas to thereby create a trench between the at least two isolation regions. The method still further includes growing a semiconductor alloy in the trench using a technique that allows ART of disclocations in the trench, to thereby obtain relaxed and substantially defect-free semiconductor alloy material in a top portion of the trench and in a contiguous area that overgrows the trench. The method further includes planarizing at least to a surface of the at least two isolation regions, and removing a top portion of the at least two isolation regions, such that the contiguous area extends upwards beyond the at least two isolation regions.

In yet another aspect, a method is disclosed that includes producing a layer of a semiconductor alloy material on a substrate, wherein the layer comprises an upper area having a relaxed and substantially defect-free condition. The method further includes etching a plurality of trenches in the layer and filling the trenches with an insulation material (e.g., an oxide). In some embodiments, the method further comprises planarizing to obtain a substrate having at least one elongate structure between at least two isolation regions, wherein each elongate structure includes a top portion of the semiconductor alloy material that has a relaxed and substantially defect-free condition. In some embodiments, the method further includes removing a top portion of the at least two isolation regions, such that at least a part of the top portion extends outwards beyond the at least two isolation regions.

In some embodiments, the semiconductor alloy material may be an alloy of Si and Ge. For example, the base portion of the fin may be formed of SiGe and the top portion of the fin may be formed of strained Ge. Other examples are possible as well.

In some embodiments, the semiconductor alloy material may have a composition given by $Si_xGe_{1-x}$, where x higher than 0.2.

In some embodiments, the substrate may be a silicon substrate.

DETAILED DESCRIPTION

Of a number of terms, the following definitions are valid within the present description as well as in the claims.

First, when a volume of a semiconductor or semiconductor alloy, for example SiGe, is said to be 'relaxed' or in 'relaxed condition', this means that the lattice parameter of the material in the volume is substantially equal to the standard equilibrium lattice parameter. In other words there is no or substantially no strain effect from the substrate on which the volume is produced having another lattice parameter (smaller in the case of SiGe grown on Si).

Second, when a volume of semiconductor or a semiconductor alloy is said to be 'strained', this means that said volume is formed of first crystalline material having a first lattice constant, and is overlying a second crystalline material having a second lattice constant different than the first, where the crystalline in-plane lattices are substantially matched at the interface between the first and second material (i.e., the first lattice is stretched or compressed to match the second lattice), thereby inducing strain in the first crystalline material.

Third, a volume of a semiconductor or semiconductor alloy (e.g. Ge or SiGe) is said to be 'defect free' when there are substantially no defects appearing as a consequence of propagating dislocations in the volume.

FIGS. 1A-F illustrate a first example method, in accordance with some embodiments. As shown, a substrate 1 is provided. The substrate 1 may be, for example, a silicon (Si) substrate. Other substrates are possible as well.

Figure 1A:
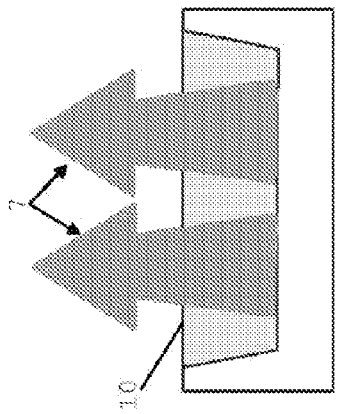
FIGS. 1A-F illustrate a first example method, in accordance with some embodiments.

As shown in FIG. 1A, a shallow trench isolation (STI) may be performed to form fin-shaped structures 2 separated by isolation regions 3. In particular, trenches may be formed in the substrate 1, and the trenches may be filled with an oxide.

In some embodiments, the oxide may extend beyond a surface of the substrate. In these embodiments, the substrate 1 and the oxide may be planarized to a level surface 14, as shown.

As a result of the STI, the fin-shaped structures 2 and isolation regions 3 may be formed. The fin-shaped structures 2 may comprise the Si of the substrate, while the isolation regions 3 may be formed of an oxide. In some embodiments, the fin-shaped structures 2 may have a width at a top of the fin-shaped structure of approximately 40 nm, for example. Other widths are possible as well.

Figure 1B:
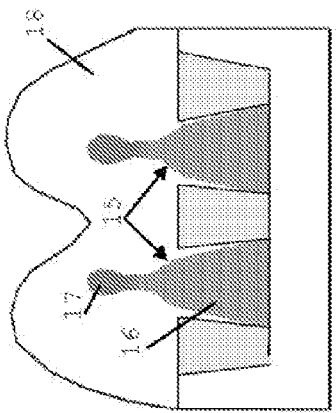

As shown in FIG. 1B, the fin-shaped structures 2 may be partially or fully removed by an etch, thereby producing trenches 4.

The trenches 4 may be filled by growing silicon germanium (SiGe) 5 in the trenches 4. In some embodiments, the SiGe may be grown using, for example, reduced pressure chemical vapor deposition. Other growth techniques are possible as well. The SiGe 5 may be a semiconductor alloy having a composition $Si_xG_{1-x}$, where x may be any suitable value known in the art for this type of alloy. In some embodiments, x may be higher than 0.2. For example, x may be approximately 0.25. Other values of x are possible as well.

Figure 1C:
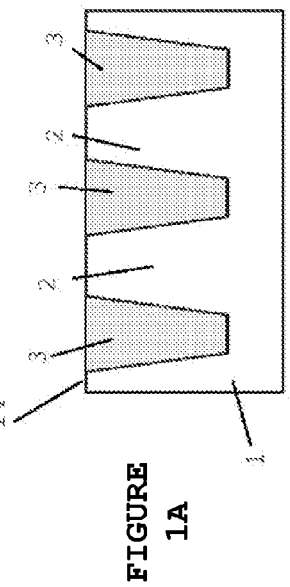

A width and depth of the trenches 4 may be suitable for aspect ratio trapping (ART) to occur. As a result of the ART, dislocations 6 may become trapped by sidewalls of the trenches 4, as shown in FIG. 1C.

Due to the growth of the SiGe 5, elongate structures 7 may be formed in the trenches, as shown. Each elongate trench 7 may include a base area 8 and an overgrowth area 9. As shown, the overgrowth area 9 is mushroom-shaped and extends above the trench 4. In a top portion of the base area 8 and in the overgrowth area 9, the SiGe 5 may be relaxed and substantially defect-free.

Figure 1D:
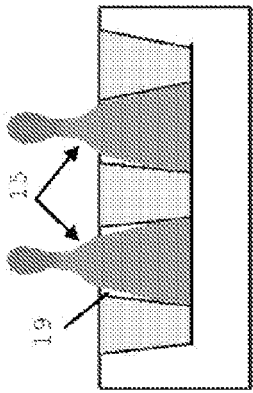

In some embodiments, an etch may be performed to remove a top portion of the isolation regions 3, with the result that a portion of the base area 8 of the elongate structures 7 extends above a surface 10 of the isolation regions 3, as shown in FIG. 1D. Alternatively, no etch may be performed, and only the overgrowth area 9 of the elongate structures may extend above the surface 10 of the isolation regions 3, as shown in FIG. 1C.

Figure 1E:
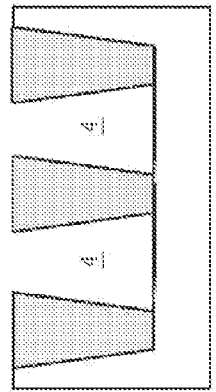

In any case, the substrate 1 including the isolation regions 3 and the SiGe 5 may be subjected to a dry oxidation at a high temperature. The oxidation may serve to transform each of the elongated structures 7 into a fin 15 and an oxide layer 18, as shown in FIG. 1E. The fin 15 may include a base portion 16 formed of SiGe and a top portion 17 formed of substantially pure strained Ge. The substantially pure strained Ge may be formed by condensation of the Ge. The oxide layer 18 may be formed by oxidation of the Si. The condensation of the Ge and the oxidation of the Si may occur substantially simultaneously in a condensation-oxidation step. The condensation-oxidation step may continue until the top portion 17 of the fin 15 contains substantially no silicon, whilst ensuring that the Ge in the top portion 17 is strained by keeping a condensed volume of the Ge below a critical volume of plastic relaxation. This critical volume depends on the lattice mismatch between Ge and the initial relaxed SiGe, which in turn depends on the initial Ge concentration.

Figure 1F:
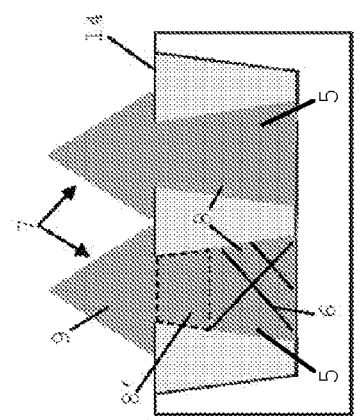

Following the condensation-oxidation, the oxide layer 18 may be removed above the surface 10 of the isolation regions 3 using an etch, as shown in FIG. 1F. As a result, the fins 15 formed from the elongated structures 7, each of which includes a top portion 17 of substantially pure strained Ge and a base portion 16 of SiGe, which may form a buffer.

In regions 19 adjacent to the base portions 16, oxide formed during the condensation-oxidation step may remain.

As a result, the fins 15 may, for example, be embedded in a continuous oxide layer. In some embodiments, a small over-etching may occur in the isolation regions 3 during removal of the oxide 18. The regions 19 adjacent to the base portions 16 may include a zone (not shown) of pure Ge or SiGe with a higher Ge content, as Ge condensation may, in some embodiments, also occur in the regions 19.

The fins 15 may be suitable for producing quantum well FinFET transistors through additional processing steps. In some embodiments, the top portions 17 of the fins 15 may have a width less than approximately 20 nm. A size of the top portion 16 may be designed by adequate design choices for the SiGe composition (that is, the value of x in $Si_xGe_{1-x}$), a size of the overgrowth areas 9, a size of the trenches 4, and the critical volume, as described above. In some embodiments, very narrow fin structures may be obtained by forming trenches 4 that are wide enough to substantially prevent twin formation during filling of the trenches 4. As a result, reduced fin sizes may be achieved without the formation of twin defects.

Figure 2A:
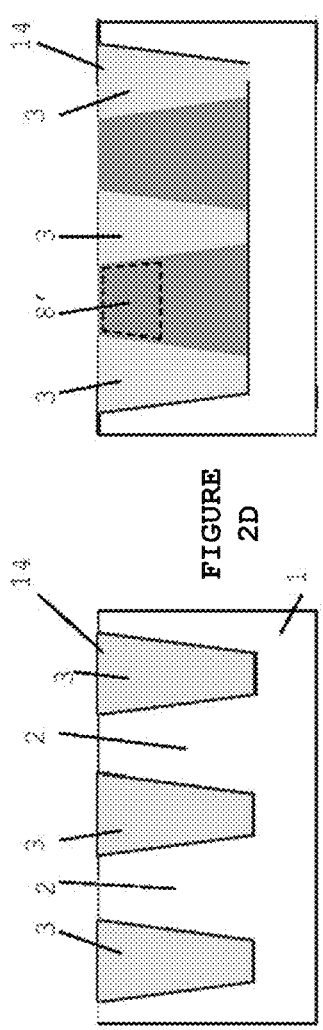
FIGS. 2A-G illustrates a second example method, in accordance with some embodiments.

FIGS. 2A-G illustrates a second example method, in accordance with some embodiments. As shown in FIG. 2A, a substrate 1 is provided. The substrate 1 may be, for example, a Si substrate. Other substrates are possible as well.

As shown in FIG. 2A, an STI may be performed to form fin-shaped structures 2 separated by isolation regions 3. In particular, trenches may be formed in the substrate 1, and the trenches may be filled with an oxide. In some embodiments, the oxide may extend beyond a surface of the substrate. In these embodiments, the substrate 1 and the oxide may be planarized to a level surface 14, as shown.

As a result of the STI, the fin-shaped structures 2 and isolation regions 3 may be formed. The fin-shaped structures 2 may comprise the Si of the substrate, while the isolation regions 3 may be formed of an oxide. In some embodiments, the fin-shaped structures 2 may have a width at a top of the fin-shaped structure of approximately 40 nm, for example. Other widths are possible as well.

Figure 2B:
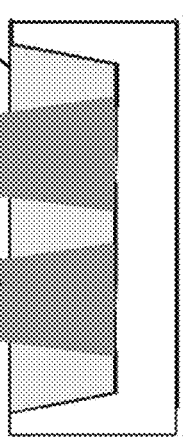

As shown in FIG. 2B, the fin-shaped structures 2 may be partially or fully removed by an etch, thereby producing trenches 4.

Figure 2C:
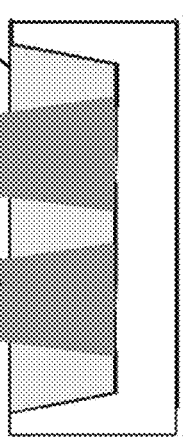

As shown in FIG. 2C, the trenches 4 may be filled by growing SiGe in the trenches 4. In some embodiments, the SiGe may be grown using, for example, reduced pressure chemical vapor deposition. Other growth techniques are possible as well. The SiGe may be a semiconductor alloy having a composition $Si_xG_{1-x}$, where x may be any suitable value known in the art for this type of alloy. In some embodiments, x may be higher than 0.2. For example, x may be approximately 0.25. Other values of x are possible as well.

A depth and width of the trenches 4 may be selected such that relaxed and substantially defect-free SiGe may be obtained in a top portion 8' and a contiguous layer 20 of SiGe grown in the trenches 4.

Figure 2D:
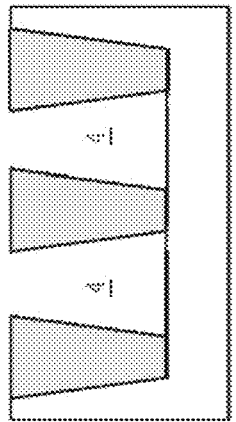

Following growth of the SiGe, a chemical mechanical polish (CMP) may be used to remove the contiguous layer 20 and planarize the substrate to a level surface 14, as shown in FIG. 2D. While the planarization is shown to stop at the level surface 14, in some embodiments the planarization may extend below the level surface 14.

Figure 2E:
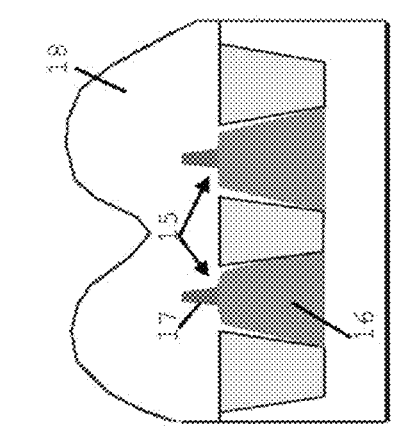

Thereafter, an etch may be performed to recess the isolation regions 3 and form elongated structures 7 of the SiGe, as shown in FIG. 2E. As shown, a portion of the elongated structures 7 may extend outwards from the surface 10 of the isolation regions 3.

Figure 2F:
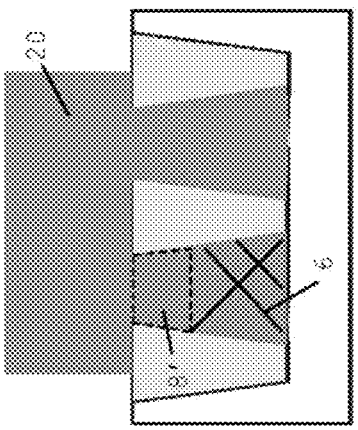

The substrate 1 including the isolation regions 3 and the elongated structures 7 may be subjected to a dry oxidation at a high temperature. The oxidation may serve to transform each of the elongated structures 7 into a fin 15 and an oxide layer 18, as shown in FIG. 2F. The fin 15 may include a base portion 16 formed of SiGe and a top portion 17 formed of substantially pure strained Ge. The substantially pure strained Ge may be formed by condensation of the Ge. The oxide layer 18 may be formed by oxidation of the Si. The condensation of the Ge and the oxidation of the Si may occur substantially simultaneously in a condensation-oxidation step. The condensation-oxidation step may continue until the top portion 17 of the fin 15 contains substantially no silicon, whilst ensuring that the Ge in the top portion 17 is strained by keeping a condensed volume of the Ge below a critical volume of plastic relaxation. This critical volume depends on the lattice mismatch between Ge and the initial relaxed SiGe, which in turn depends on the initial Ge concentration.

Figure 2G:
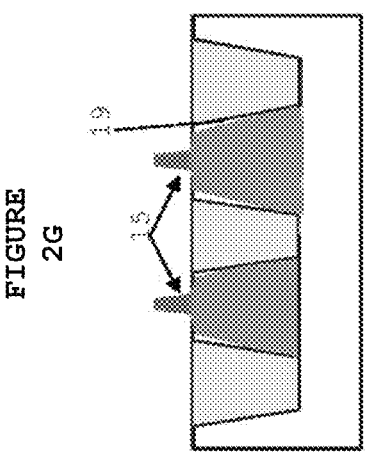

Following the condensation-oxidation, the oxide layer 18 may be removed above the surface 10 of the isolation regions 3 using an etch, as shown in FIG. 2G. As a result, the fins 15 formed from the elongated structures 7, each of which includes a top portion 17 of substantially pure strained Ge and a base portion 16 of SiGe, which may form a buffer. As shown, regions 19 adjacent to the base portions 16 may include oxide formed during the condensation-oxidation step. As a result, the fins 15 may, for example, be embedded in a continuous oxide layer.

In some embodiments, a Si cap layer may be deposited (e.g., by epitaxial growth) on the elongate structures 7 prior to the condensation-oxidation step. The Si cap layer may avoid oxidation of the Ge. To this end, when the oxidation begins, the Si cap layer may form a silicon oxide layer that obstructs formation of Ge oxide. As a result, the Ge may move towards the top portion 17 by condensation. In some embodiments, oxidation of the Si cap layer may take place at a temperature lower than oxidation of the SiGe.

While the foregoing description focused on Si and Ge, in some embodiments other semiconductor materials may be used. In general, a first semiconductor and a second semiconductor may be used so long as their compound is susceptible to a selective condensation-oxidation step, where the second semiconductor material forms a top portion of a fin by condensation and the first semiconductor material forms an oxide layer over the fin by oxidation.

In some embodiments, a diffusion anneal may be combined with the condensation-oxidation step in a cyclic process, so as to enhance interdiffusion of the semiconductor materials in the semiconductor alloy (e.g., Si and Ge). To this end, the substrate 1 including the isolation regions 3 and the elongated structures 7 may be subjected to a condensation-oxidation (e.g., at 900° C.) during a first timespan, and then may be subjected to a diffusion anneal (e.g., in an inert gas and, e.g., at the same temperature) during a second timespan. The condensation-oxidation followed by the diffusion anneal may be repeated at least once. It will be understood that this condensation-oxidation/diffusion anneal cyclic process may, in some embodiments, be substituted for the condensation-oxidation step described above.

In some embodiments, the elongated structures 7 may be obtained in a manner other than that shown in FIGS. 1A-F and 2A-G. For example, a layer of SiGe may be grown on the substrate 1 to a sufficiently high thickness that an upper portion of the SiGe is in a relaxed, substantially defect-free condition. That is, the thickness may be sufficient that dislocations caused by a mismatch between the SiGe and the underlying substrate do not propagate into the upper portion. This thickness may be, for example, a few microns. In embodiments where the semiconductor alloy material is SiGe, the layer may have a Ge gradient in order to bend dislocation defects, thereby forming a graded strain relaxed buffer. Thereafter, a patterning and etching step may be performed to produce trenches in the SiGe layer, and the trenches may be filled with an insulation material (e.g., Si oxide) to form the isolating regions 3. Possibly after a planarization step, a structure may be obtained resembling that shown in FIG. 2D, including elongate structures 7 of SiGe in between isolation areas 3, where a top portion 8' of the SiGe is relaxed and substantially defect-free. The remaining steps (e.g., those shown in FIGS. 2E-G) and described above in relation to these figures may be performed in the same way.

Another example method is described below. The method may, for example, be similar to that shown in FIGS. 1A-F. The method may begin by providing a Si wafer having fin-shaped areas of Si that are approximately 40 nm and Si oxide STI regions that separate the fin-shaped areas.

The Si wafer may be loaded into an epitaxy chamber and baked at 850° C. to remove the Si wafer's native oxide. A portion of the Si in the fin-shaped areas may then be removed to a depth of approximately 300 nm using a hydrogen chloride vapor etch performed in situ in the epitaxy chamber at 850° C., thereby forming trenches.

Thereafter, SiGe may be grown in the trenches using reduced pressure chemical vapor deposition (RPCVD) at 20 Torr and 550° C. The SiGe may be grown to a thickness of 400 nm, such that the SiGe includes an overgrowth above the trenches.

A 2 nm Si cap layer may then be formed on the SiGe using RPCVD at 600° C. The Si cap layer may be oxidized at 700° C.

Thereafter, a condensation-oxidation step may be performed at 900° C. A timespan of the condensation-oxidation step may range from minutes to hours. The condensation-oxidation step may result in a fin and an oxide layer (e.g., of $SiO_2$), as described above.

The oxide layer be removed by a wet etch (e.g., a hydrogren fluoride dip). The etch may be a conformal etch (in which substantially the same thickness of the oxide layer may be removed everywhere). A portion of oxide may remain in regions adjacent to a base portion of the fin, as described above.

While the disclosure has been illustrated and described in detail in the drawings and foregoing description, such illustration and description are to be considered illustrative or exemplary and not restrictive. Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The foregoing description details certain embodiments of the disclosure. It will be appreciated, however, that no matter how detailed the foregoing appears in text, the disclosure may be practiced in many ways, and is therefore not limited to the embodiments disclosed. It should be noted that the use of particular terminology when describing certain features or aspects of the disclosure should not be taken to imply that the terminology is being re-defined herein to be restricted to include any specific characteristics of the features or aspects of the disclosure with which that terminology is associated.

Unless specifically specified, the description of a layer being deposited or produced 'on' another layer or substrate, includes the options of (1) the layer being produced or deposited directly on, i.e. in contact with, said other layer or substrate, and (2) the layer being produced on one or a stack of intermediate layers between said layer and said other layer or substrate.

The invention claimed is:

1. A method comprising:
   providing a substrate that defines an upper surface and comprising at least two fin-shaped areas separated by an isolation region;
   forming trenches in the substrate in the at least two fin-shaped areas, wherein the trenches are about 300 nm deep;
   growing a semiconductor alloy material at least in the trenches using a technique that allows aspect ratio trapping of dislocations in the trenches, thereby forming at least two elongated structures separated by the isolation region, wherein, for each of the at least two elongated structures: (i) the elongated structure comprises the semiconductor alloy material of a first semiconductor material and a second semiconductor material, and (ii) a relaxed portion of the elongated structure below the upper surface of the substrate comprises the semiconductor alloy material in a relaxed and substantially defect-free condition, wherein the substantially defect-free condition is achieved when there are substantially no defects appearing as a consequence of propagating dislocations in the semiconductor alloy material;
   subjecting the substrate to a condensation-oxidation, such that, for each of the at least two elongated structures, the elongated structure forms a fin and an oxide layer, wherein (i) the fin comprises a fin base portion formed of the semiconductor alloy material and a fin top portion of the first semiconductor material in a strained condition, the fin top portion being formed by condensation of the first semiconductor material, and (ii) the oxide layer comprises an oxide of the second semiconductor material, the oxide layer being formed by oxidation of the second semiconductor material; and
   removing at least some of the oxide layer.

2. The method of claim 1, wherein:
   growing the semiconductor alloy material at least in the trenches comprises growing the semiconductor alloy material in the trenches and in an overgrowth that extends above a surface of the isolation region; and
   the relaxed portion comprises a top portion of the semiconductor alloy material in the trenches and the overgrowth.

3. The method of claim 1, wherein the isolation region is formed of an oxide, further comprising removing a top portion of the isolation region between at least two of the elongated structures, such that the semiconductor alloy material extends above a surface of the isolation region.

4. The method of claim 1, wherein the first material comprises germanium and the second material comprises silicon.

5. The method of claim 4, wherein the semiconductor alloy material has a composition given by $Si_xGe_{1-x}$, with x being greater than 0.2.

6. The method of claim 1, wherein the substrate comprises silicon.

7. The method of claim 1, further comprising, prior to subjecting the substrate to a condensation-oxidation:
   forming a cap layer of the second semiconductor material on each of the at least two elongated structures; and
   oxidizing the cap layer.

8. The method of claim 7, wherein:
the condensation-oxidation is performed at a first temperature; and
oxidizing the cap layer is performed at a second temperature different than the first temperature.

9. A method, comprising:
providing a wafer comprising at least two fin-shaped areas separated by an isolation region;
forming trenches in the wafer in the at least two fin-shaped areas;
growing a semiconductor alloy material in the trenches and in a contiguous area between at least two adjacent trenches using a technique that allows aspect ratio trapping of dislocations in the trenches;
planarizing to remove a top portion of the isolation region, such that the semiconductor alloy material extends above a surface of the isolation region, thereby forming at least two elongated structures, wherein, for each of the at least two elongated structures: (i) the elongated structure comprises a semiconductor alloy of a first semiconductor material and a second semiconductor material, and (ii) a relaxed portion of the elongated structure comprises the semiconductor alloy in a relaxed and substantially defect-free condition; and
subjecting the substrate to a condensation-oxidation, such that, for each of the at least two elongated structures, the elongated structure forms a fin and an oxide layer, wherein (i) the fin comprises a fin base portion formed of the semiconductor alloy and a fin top portion of the first semiconductor material in a strained condition, the fin top portion being formed by condensation of the first semiconductor material, and (ii) the oxide layer comprises an oxide of the second semiconductor material, the oxide layer being formed by oxidation of the second semiconductor material.

10. The method of claim 9, further comprising removing at least some of the oxide layer.

11. The method of claim 9, wherein the first material comprises germanium and the second material comprises silicon, and wherein the substrate comprises silicon.

12. The method of claim 11, wherein the semiconductor alloy material has a composition given by $Si_xGe_{1-x}$, with x being greater than 0.2.

13. The method of claim 1, wherein subjecting the substrate to a condensation-oxidation is performed during a first timespan, wherein the method further includes subjecting the substrate to a diffusion anneal during a second timespan.

14. The method of claim 2, wherein the substrate is a Si substrate, wherein providing the substrate includes baking the Si substrate in an epitaxy chamber to remove a native oxide of the substrate, wherein forming trenches in the substrate includes removing a portion of the Si substrate using a vapour etch performed in situ in the epitaxy chamber, wherein growing the semiconductor alloy material at least in the trenches uses reduced pressure chemical vapour deposition, and wherein removing at least some of the oxide layer is performed by a wet etch.

15. The method of claim 9, wherein subjecting the substrate to a condensation-oxidation is performed during a first timespan, wherein the method further includes subjecting the substrate to a diffusion anneal during a second timespan.

16. The method of claim 10, wherein the wafer is a Si wafer, wherein providing the wafer includes baking the Si wafer in an epitaxy chamber to remove a native oxide of the wafer, wherein forming trenches in the wafer includes removing a portion of the Si wafer using a vapour etch performed in situ in the epitaxy chamber, wherein growing the semiconductor alloy material in the trenches uses reduced pressure chemical vapour deposition, and wherein removing at least some of the oxide layer is performed by a wet etch.

17. A method comprising:
providing a substrate comprising at least two fin-shaped areas separated by an isolation region along substantially an entire height of the fin-shaped areas;
forming tapered trenches in the substrate in the at least two fin-shaped areas, wherein a width at a top of the trench is narrower than a width at a bottom of the trench;
growing a semiconductor alloy material at least in the trenches using a technique that allows aspect ratio trapping of dislocations in the trenches, thereby forming at least two elongated structures separated by the isolation region, wherein the semiconductor alloy material is different from the substrate, and wherein, for each of the at least two elongated structures: (i) the elongated structure comprises a semiconductor alloy of a first semiconductor material and a second semiconductor material, and (ii) a relaxed portion of the elongated structure comprises the semiconductor alloy in a relaxed and substantially defect-free condition, wherein the substantially defect-free condition is achieved when there are substantially no defects appearing as a consequence of propagating dislocations in the semiconductor alloy;
subjecting the substrate to a condensation-oxidation, such that, for each of the at least two elongated structures, the elongated structure forms a fin and an oxide layer, wherein (i) the fin comprises a fin base portion formed of the semiconductor alloy and a fin top portion of the first semiconductor material in a strained condition, the fin top portion being formed by condensation of the first semiconductor material, and (ii) the oxide layer comprises an oxide of the second semiconductor material, the oxide layer being formed by oxidation of the second semiconductor material; and
removing at least some of the oxide layer.

18. The method of claim 17, wherein the isolation region is formed of an oxide, and wherein the method further comprises removing a top portion of the isolation region between at least two of the elongated structures, such that the semiconductor alloy material extends above a surface of the isolation region.

19. The method of claim 1, wherein an upper width of the trenches is less than a bottom width of the trenches, and wherein the bottom width is spaced from the upper surface of the substrate.

20. The method of claim 9, wherein the trenches are tapered to be narrower toward an upper surface of the wafer.

* * * * *